(12) United States Patent
Fujimori

(10) Patent No.: US 6,266,283 B1
(45) Date of Patent: Jul. 24, 2001

(54) SEMICONDUCTOR MEMORY DEVICE

(75) Inventor: Yasuhiko Fujimori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/472,429

(22) Filed: Dec. 27, 1999

(30) Foreign Application Priority Data

Dec. 25, 1998 (JP) .................................................. 10-370171

(51) Int. Cl.[7] .................................................. G11C 7/00
(52) U.S. Cl. ...................... 365/189.05; 365/194; 327/298
(58) Field of Search ............................... 365/189.05, 194, 365/193; 327/298, 119, 291

(56) References Cited

U.S. PATENT DOCUMENTS 6,104,225 * 8/2000 Taguchi et al. ........................ 327/298

* cited by examiner

*Primary Examiner*—Vu A. Le
(74) *Attorney, Agent, or Firm*—Young & Thompson

(57) ABSTRACT

The present invention provides a semiconductor memory device has an input first stage circuit for receiving an external input of a clock signal, an output circuit connected to the input first stage circuit for receiving an output signal from the input first stage circuit so that the output circuit outputs data on the basis of the output signal, a delay device connected to the input first-stage circuit for delaying the output signal from the input first-stage circuit in order for synchronizing in timing between the data from the output circuit and the lock signal, wherein the delay device further comprises an output delay circuit having a circuit configuration substantially identical with or equivalent to a circuit configuration of the output circuit, and an input delay circuit being connected to the output delay circuit and the input delay circuit having a circuit configuration substantially identical with or equivalent to a circuit configuration of the input first-stage circuit.

14 Claims, 14 Drawing Sheets

SEMICONDUCTOR MEMORY DEVICE

BACKGROUND OF THE INVENTION

The present invention relates to a semiconductor memory device, and more particularly to a data input/output device for a semiconductor memory device provided with a delay circuit for synchronizing in timing between a clock signal and a data stroboscopic signals and data signals.

As the high speed performance of the computer system has been improved, the high speed performance of the semiconductor memory device depends upon the data transfer rate. There was proposed a double data rate for conducting two times data input/output operations in one clock in order to improve the data transfer rate. FIG. 1 is a timing chart illustrative of waveforms of double data rate operations static random access memory. Data stroboscopic signals (DQS) and data signals (DQ) are outputted in synchronizing with rising edge of clock signal (CLK) and reversed phase clock signal (CLBK), so that two times of the data input and output operations are conducted in one clock. In order to realize the double data rate, there are used a clock synchronizing circuit with a feed-back system such as a phase-locked loop and a delay-locked loop, and a clock synchronizing circuit with a sequence control system such as a synchronous mirror delay as disclosed in Japanese laid-open patent publication No. 8-237091 and a clock supplying semiconductor circuit as disclosed in Japanese laid-open patent publication No. 9-152656.

FIG. 2 is a block diagram illustrative of a circuit configuration of a digital delay-locked loop circuit. The clock signal CLK and the reversed phase clock signal CLKB are inputted into two input terminals. First and second output enable signal generator systems 500 and 510 are provided, each of which is connected to the two input terminals individually. The first and second output enable signal generator systems 500 and 510 generate output enable signals 1 and 2 respectively on the basis of the inputs of the clock signal CLK and the reversed phase clock signal CLKB. An output circuit 520 is provided which is connected to the individual output terminals of the first and second output enable signal generator systems 500 and 510. The output circuit 520 receives the output enable signals 1 and 2 from the first and second output enable signal generator systems 500 and 510 so that the output circuit 520 generates a data signal DQ or a data stroboscopic signal SQS in accordance with the output enable signals 1 and 2 and internal data. An end circuit 530 is provided which is connected to the output circuit 520 for receiving the data signal DO or the data stroboscopic signal SQS from the output circuit 520 so that the end circuit 530 generates a signal necessary for access measurement on the basis of the data signal DQ or the data stroboscopic signal SQS. Each of the first and second output enable signal generator systems 500 and 510 has an input first stage circuit 501 which is connected to the two input terminals for receiving the clock signal CLK and the reversed phase clock s:. Each of the first and second output enable signal generator systems 500 and 510 also has a delay circuit alignment 502 connected to the input first stage circuit 501 for receiving an output signal from the input first stage circuit 501 for delaying the output signal. Each of the first and second output enable signal generator systems 500 and 510 also has a buffering circuit 506 which is connected to the delay circuit alignment 502 for receiving an output signal from the delay circuit alignment 502. Each of the first and second output enable signal generator systems 500 and 510 also has a delay device 505 which is connected to the delay circuit alignment 502 for delaying the output signal from the delay circuit alignment 502 in consideration of the delay times of the input first stage circuit 501, the buffering circuit 506, the output circuit 520, and the end circuit 530. The delay device 505 delays the output signal 4 from the delay circuit alignment 502 to generate a delayed output signal 5. Each of the first and second output enable signal generator systems 500 and 510 also has a phase comparator 503 which has two inputs connected to the output of the input first stage circuit 501 for receiving the output signal 3 from the input first stage circuit 501 and also receiving the output signal 5 from the delay device 505, so that the phase comparator 503 compares phases between the output signals 3 and 5. Each of the first and second output enable signal generator systems 500 and 510 also has a control circuit 504 which is connected to the phase comparator 503 for receiving an output from the phase comparator 503 to generate a control signal on the basis of the output signal from the phase comparator 503. The control circuit 504 is also connected to the delay circuit alignment 502 to send the control signal to the delay circuit alignment 502 for controlling the delay of the delay circuit alignment 502. The first and second output enable signal generator systems 500 and 510 are different only in operations in reversed phases to each other.

FIG. 3 is a timing chart illustrative of waveforms in operations of the delay-locked loop circuit of FIG. 2. "t0" is a delay time defined from a cross point of a rising or falling edge of the clock signal (CLK) and the reversed phase clock signal (CLKB) to a rising edge of the output signal 3 from the input first stage circuit 501. "t1" is a delay time defined from a rising edge of the output enable signals 1 and 2 of the output circuit 520 to an access measurement point of the end circuit 530. "t2" is a delay time defined from the rising edge of the reference signal 4 to the rising edge of the output enable signal. "t5" is a delay time of the delay device 505.

The delay time "t5" of the delay device 505 is given by the following equation.

$$t5=(t0+t1+t2) \tag{1}$$

Skew tAC and tDQSCK of he clock signal CLK or the reversed phase clock signal CLKB and the data signal DQ and the data stroboscopic signal DQS are adjusted to the following regulation. The delay device 505 delays in a total amount of individual delay times of the input first stage circuit 501, the output circuit 520, the end circuit 530 and the buffering circuit 506, so that a timing synchronizing between the output signals 3 and 5 is made by the phase comparator 503 and the control circuit 504.

FIG. 4 is a block diagram illustrative of a clock supplying semiconductor circuit. FIG. 5 is a timing chart illustrative of waveforms of a clock supplying semiconductor circuit of FIG. 4 An output enable signal generating system 700 has an input first state circuit 501, control circuits 710 and 780, delay circuit alignments 760 and 790 and pulse generator circuits 770 and 800. The output enable signal generating system 700 generates an output enable signal 1 which is to be inputted into the input circuit 520. An output enable signal generating system 810 has the same circuit configuration as the output enable signal generating system 700. The output enable signal generating system 810 generates an output enable signal 2 which is to be inputted into the input circuit 520. The end circuit 530 is connected to the output terminal o the output circuit 520. The delay circuit alignment 760 has four delay circuits 720, 730, 740 and 750. There are provided two flip-flop circuits 702 and 711, two AND-gates 712 and 773. The pulse generator circuit 770 has a delay circuit 771. There are provided three inverters 701, 703 and 705. A delay device 704 is further provided for timing synchronization of the clock supply semiconductor circuit.

A delay time "t6" of the delay device 704 is defined to be represented by the following equation.

$$t6=(t0+t1+t2+t3\times 2) \qquad (2)$$

Skew tAC and tDQSCK of he clock signal CLK or the reversed phase clock signal CLKB and the data signal DQ and the data stroboscopic signal DQS are adjusted to the following regulation. "t3" is a delay time defined from a rising edge of the output signal 3 from the input first stage circuit 501 to either a falling edge of a return signal 7 or a rising edge of a return signal 6 of a delay chain of the clock supply semiconductor circuit.

In the static random access memory operable in double data rate, tAC and tDQSCK are ±0.1×tCK. If the clock frequency tCK of the clock signal CLK is 10 nanoseconds or 100 MHz, then tAC=±1 nanosecond. This regulation includes variations of output, voltage, and temperature and variations caused in manufacturing processes, for which reason it is important to do a highly accurate adjustment to the delay times "t5" and "t6" of the delay devices 505 and 704. FIG. 6A is a circuit diagram illustrative of a first conventional circuit configuration of a delay device. Each of the delay devices 505 and 704 may has a circuit configuration of an inverter chain as shown in FIG. 6A, wherein a plurality of inverters 1200, 1201, 1202 and 1203 are connected in series to form a multi-stage inverter chain so that the delay time corresponds to the delay time "t5" or "t6". FIG. 6B is a circuit diagram illustrative of a second conventional circuit configuration of a delay device. Alternatively, each of the delay devices 505 and 704 may has another circuit configuration of an inverter chain connected with capacitors as shown in FIG. 6B, wherein a plurality of inverters 1204, 1205, 1206 and 1207 are connected in series to form a multi-stage inverter chain and capacitors 1208 and 1209 are connected to the multi-stage inverter chain. Still another method for adjusting the delay time is to adjust a transistor size.

If the delay devices 505 and 704 comprise the above multi-stage inverter chains, then a problem is raised with an enlargement of error due to variations in voltage, temperature and manufacturing variation. Particularly, in the above equations (1) and (2), the delay times "t2" and "t3" are caused by the logic devices, for which reason it is not so difficult to adjust the delay time. However, the delay times "t5" and "t6" include the delay time "t0+ti" which are caused by the non-logic circuits, for which reason the errors may become remarkable.

The output circuit 520 has the following problem. There may be raised variations in power ratio between p-channel and n-channel MOS field effect transistors as the output transistors, whereby the delay times of the output circuit are different between in high level output and low level output. Therefore, it is difficult to adjust the delay time of the output circuit because the delay time of the output circuit largely depends upon the delay times of the output transistors. In the input first stage circuit, high and low levels of the clock signal CLK and the reversed phase clock signal CLKB are set about 1.6V and 0.9V respectively in accordance with the SSTL2 regulation. In consideration of the variations in the conditions of the conventional circuit configuration, it is difficult to adjust the delay time.

In the above circumstances, it had been required to develop a novel semiconductor memory device free from the above problem.

SUMMARY OF THE INVENTION

Accordingly, it is an object of the present invention to provide a novel semiconductor memory device free from the above problems.

It is a further object of the present invention to provide a novel semiconductor memory device which allows adjustment to delay times of an input first stage circuit, an output circuit and an end circuit in response to variations of power voltage, temperature and any variations caused in manufacturing processes.

The present invention provides a semiconductor memory device has an input first stage circuit for receiving an external input of a clock signal, an output circuit connected to the input first stage circuit for receiving an output signal from the input first stage circuit so that the output circuit outputs data on the basis of the output signal, a delay device connected to the input first-stage circuit for delaying the output signal from the input first-stage circuit in order for synchronizing in timing between the data from the output circuit and the lock signal, wherein the delay device further comprises an output delay circuit having a circuit configuration substantially identical with or equivalent to a circuit configuration of the output circuit, and an input delay circuit being connected to the output delay circuit and the input delay circuit having a circuit configuration substantially identical with or equivalent to a circuit configuration of the input first-stage circuit.

The above and other objects, features and advantages of the present invention will be apparent from the following descriptions.

BRIEF DESCRIPTION OF THE DRAWINGS

Preferred embodiments according to the present invention will be described in detail reference to the accompanying drawings.

DISCLOSURE OF THE INVENTION

Figure 1:
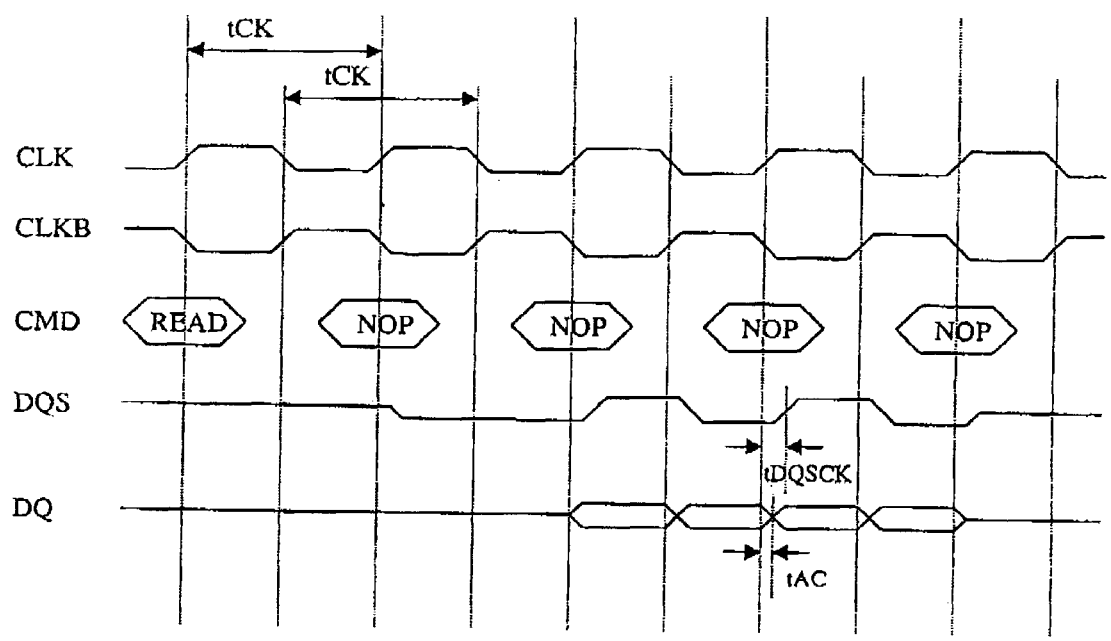
FIG. 1 is a timing chart illustrative of waveforms of double data rate operations static i access memory.

In accordance with the present invention, a semiconductor memory device has an input first stage circuit for receiving an external input of a clock signal, an output circuit connected to the input first stage circuit for receiving an output signal from the input first stage circuit so that the output circuit outputs data on the basis of the output signal, a delay device connected to the input first-stage circuit for delaying the output signal form the input first-stage circuit in order for synchronizing in timing between the data from the output circuit and the lock signal, wherein the delay device further comprises an output delay circuit having a circuit configuration substantially identical with or equivalent to a circuit configuration of the output circuit, and an input delay circuit being connected to the output delay circuit and the input delay circuit having a circuit configuration substantially identical with or equivalent to a circuit configuration of the input first-stage circuit.

It is preferable that the delay device comprises a first output delay circuit having a circuit configuration substantially identical with or equivalent to a circuit configuration of an access path circuit of the output circuit, a second output delay circuit having a circuit configuration substantially identical with or equivalent to a circuit configuration of the first output delay circuit and being operable in reverse phase to the first output delay circuit, and an input delay circuit connected to the first and second output delay circuits and the input delay circuit having a circuit configuration substantially identical with or equivalent to a circuit configuration of the input first-stage circuit, so that upon input of the clock signal, the first output delay circuit outputs a first delay signal having a first delay time equal to a delay time in a low level output from the output circuit, whilst the second output delay circuit outputs a second delay signal having a second delay time equal to a delay time in a high level output from the output circuit, whereby the input delay circuit receives the first and second signals from the first and second output delay circuits so as to output a third delay signal having a third delay time equal to a delay time of the input first stage circuit.

It is preferable to further provide a first end circuit connected between the first output delay circuit and the input delay circuit for reducing an amplitude of the first delay signal to send an amplitude-reduced first delay signal to the input delay circuit, and a second end circuit connected between the second output delay circuit and the input delay circuit for reducing an amplitude of the first delay signal to send an amplitude-reduced first delay signal to the input delay circuit.

It is preferable that the first and second output delay circuits and the input delay circuit are reduced in size as compared to the output circuit and the input first stage circuit. In this case, it is further preferable that each of the first and second output delay circuits has a dummy output transistor.

It is also preferable to further provide a control circuit connected to the first and second end circuits and also connected to the input delay circuit for activating the first and second end circuits and the input delay circuit after a reference signal has been inputted into any one of the first and second output delay circuits, and also for inactivating the first and second end circuits and the input delay circuit after a signal has been outputted from the input delay circuit.

Upon input of the reference signal, the first and second output delay circuits are operated in opposite phases to each other, so as to output first and second delay output signals having a large amplitude which is close to an amplitude defined between a power voltage and a ground voltage. The first and second end circuits reduce the amplitudes of the first and second delay output signals to output first and second amplitude-reduced delay output signals. The first and second amplitude-reduced delay output signals are inputted into the input delay circuit. The input delay circuit outputs an output signal. A delay time tL' from a rising edge of the reference signal to a falling edge of the first amplitude-reduced delay output signal is adjusted to be equal to a delay time tL from an activation of the output enable signal of the output circuit to an output of the high level. A delay time tH' from the rising edge of the reference signal to a rising edge of the second amplitude-reduced delay output signal is adjusted to be equal to a delay time tH of a low level output L from the output circuit. A delay time t0' from a cross point of the first and second amplitude-reduced delay output signals to a rising edge of the output signal from the input delay circuit is adjusted to be equal to a delay time t0 from a cross point of the clock signal CLK and the reversed phase clock signal CLKB in the input first stage circuit to a rising edge of the output signal of the input first stage circuit.

The delay circuit is used as the delay device which has the same circuit configurations as the input first stage circuit, the output circuit and the delay circuit or size-reduced circuit thereof, so as to obtain the same delay time as the delay times of the input first stage circuit and the output circuit, whereby a highly accurate adjustment to the delay time is achieved. If the end circuits are optionally provided, the same or size-reduced end circuits are connected to the delay circuit so that a highly accurate adjustment to the delay time is achieved. As the output delay circuit, there are provided first and second output delay circuits for high and low level outputs, so that if he delay time is different between in high level output and low level output, an intermediate delay time can be obtained, whereby a highly accurate adjustment to the delay time is achieved. This highly accurate adjustment to the delay time is available in wide ranges of voltage, temperature, manufacturing variation and frequency. It is also possible to do size-reductions to the individual circuits of the delay circuit so that the delay circuit is reduced in size and a consumed current can be reduced.

PREFERRED EMBODIMENT

Figure 7:
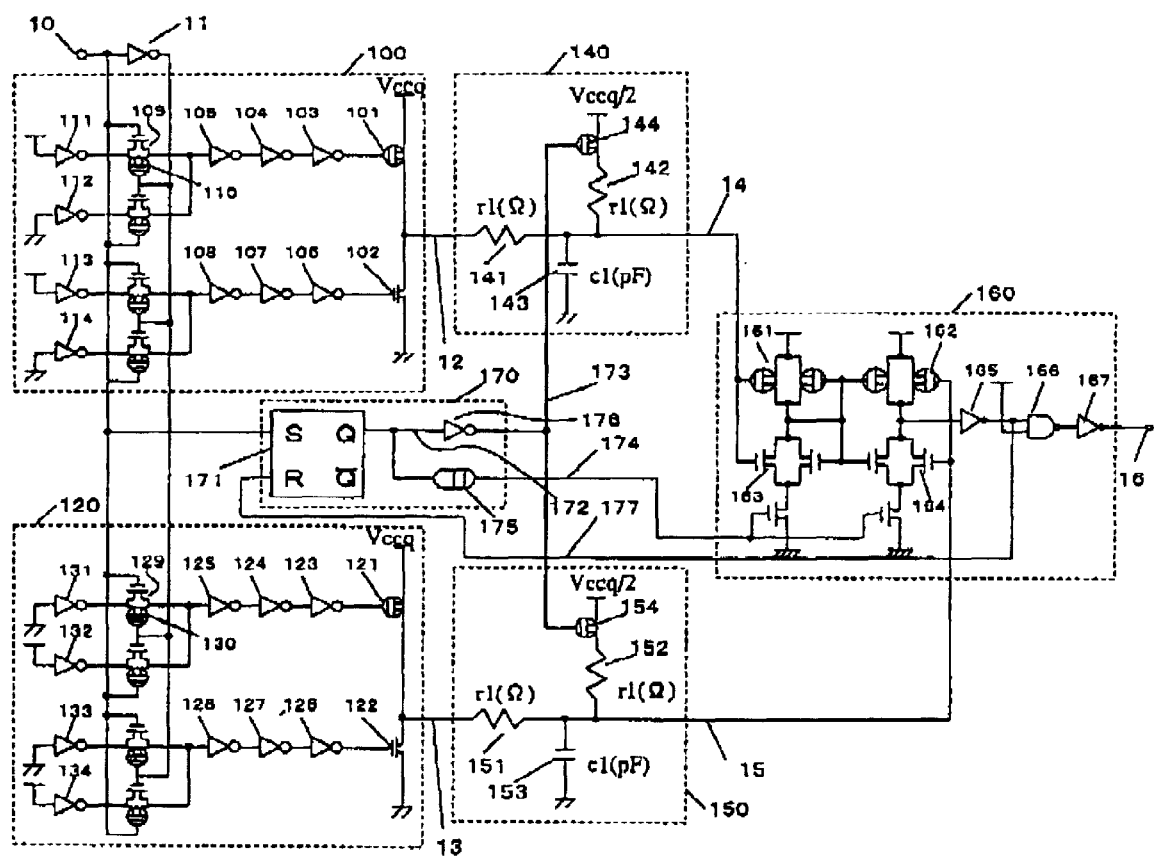
FIG. 7 is a first novel delay circuit in a first embodiment in accordance with the present invention.

A first embodiment according to the present invention will be described in detail with reference to the drawings. The invention is applied to a delay-locked loop circuit of FIG. 2. As the delay device 505 of FIG. 2, a delay circuit as shown in FIG. 7 is used. FIG. 7 is a first novel delay circuit in a first embodiment in accordance with the present invention. The delay circuit comprises a first output delay circuit 100 and a second output delay circuit 120 operable in opposite phase to the first output delay circuit 100, a first end circuit 140 connected to the first output delay circuit 100, a second end circuit 150 connected to the second output delay circuit 120, an input delay circuit 160 connected to the first and second end circuits 140 and 150, an inverter 11 connected to the first and second output delay circuits 100 and 120 for inputting input signals in normal and opposite phases thereto, and a control circuit 170 connected to the first and second end circuits 140 and 150 and the input delay circuit 160.

Figure 2:
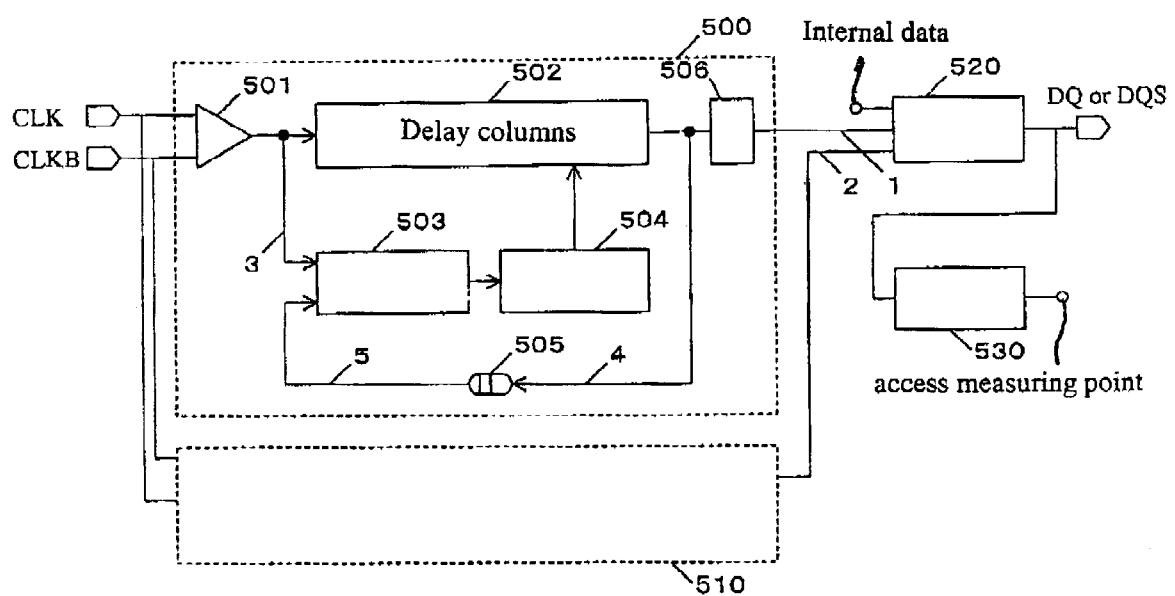
FIG. 2 is a block diagram illustrative of a circuit configuration of a digital delay-locked loop circuit.
Figure 3:
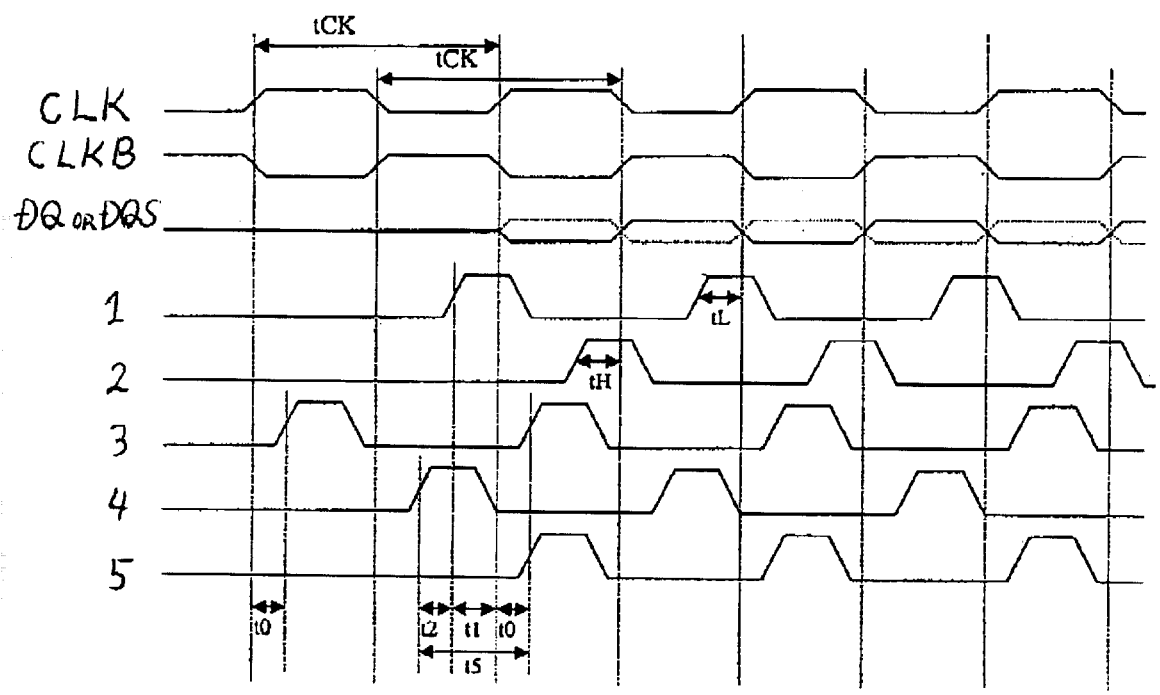
FIG. 3 is a timing chart illustrative of waveforms in operations of the delay-locked loop circuit of FIG. 2.
Figure 8:
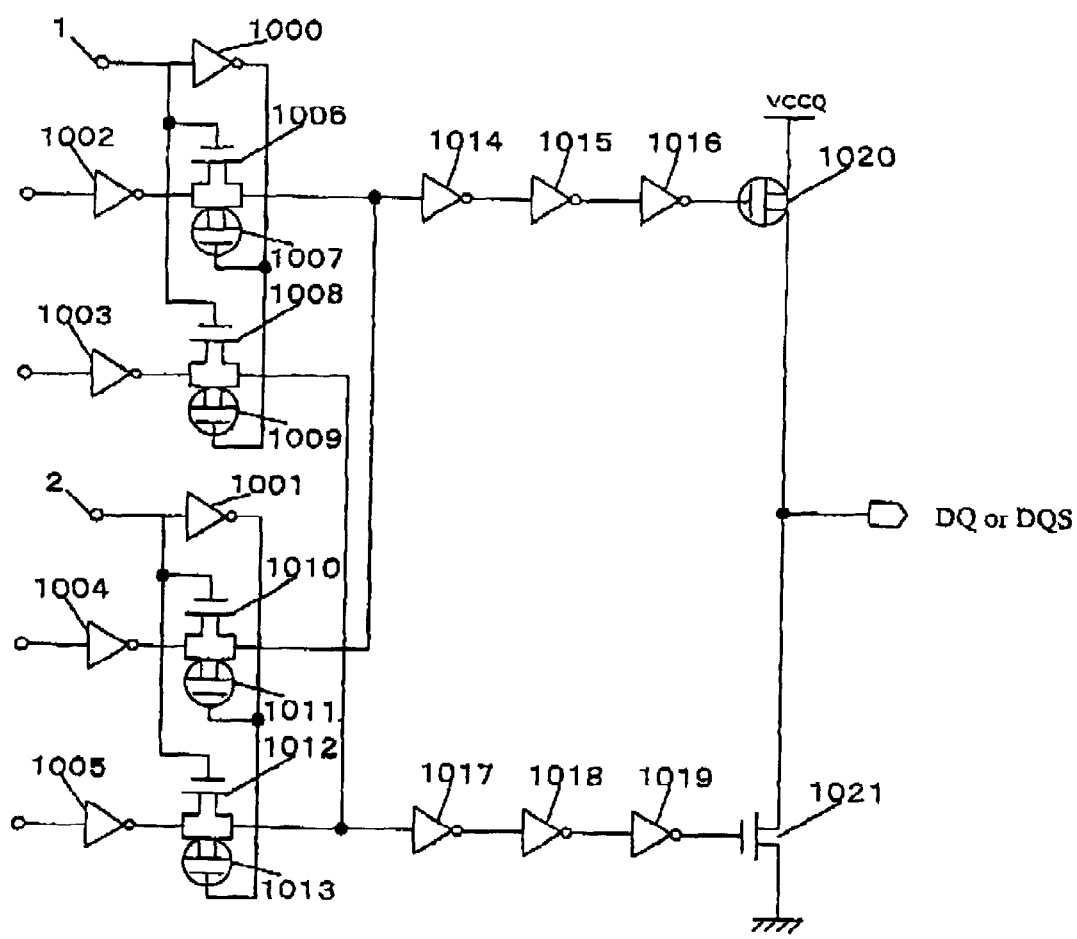
FIG. 8 is a circuit diagram illustrative of a circuit configuration of an output circuit.

The first output delay circuit has the same circuit configuration as the output circuit shown in FIG. 2. FIG. 8 is a circuit diagram illustrative of a circuit configuration of an output circuit. Transistors sizes are reduced even the same size transistors may be used. The output transistors 1020 and 1021 have large gate lengths of about a few hundred micrometers thereby enlargement in circuit scale of the delay circuit, resulting in an enlargement in scale o the delay-locked loop circuit. The transistor sizes are reduced to be one fifth. It is also preferable that interconnections between transistors are also made of the same material and are reduced in length to one fifth.

Upon rising edge of the signal 10, the signal 12 is changed from the high level to the low level. Upon falling edge of the signal 10, the signal 12 is changed from the low level to the high level. The signal 12 has a large amplitude which is close to an amplitude defined between the power voltage and the ground voltage.

The second output delay circuit 120 has the same circuit configuration as the first output delay circuit 100 as shown in FIG. 7. A difference in the circuit configuration of the second output delay circuit 120 from the first output delay circuit 100 is in that the gate voltages to the inverters 131 through 134 are inputted in opposite phases to the gate voltages to the inverters 111 through 114. The signal 13 is changed from the low level to the high level upon the rising edge of the signal 10. The signal 13 is changed from the high level to the low level upon the falling edge of the signal 10. The signal 13 is inputted into the second end circuit 150.

Figure 9:
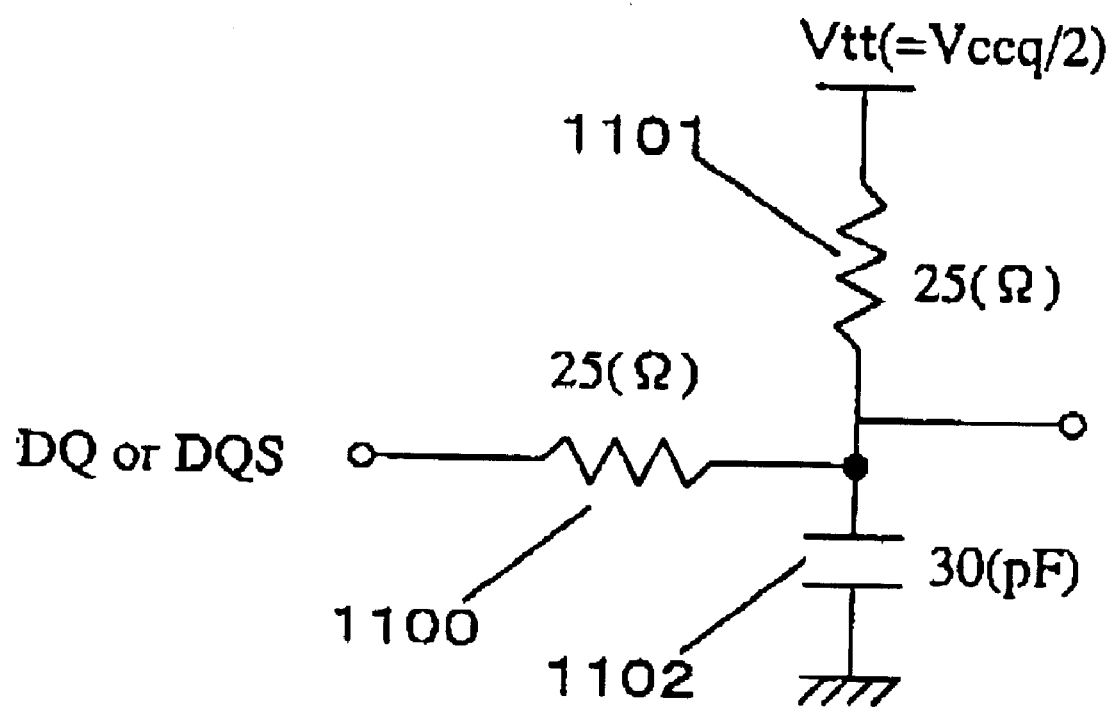
FIG. 9 is a circuit diagram illustrative of an end circuit.

The first end circuit 140 comprises the p-channel switching MOSFET 144, resistances 141 and 142 and a capacitor 143. The first end circuit 140 has the same circuit configuration as the end circuit 530 of FIG. 9 which is a circuit diagram illustrative of an end circuit. The first end circuit 140 is reduced in size to one fifth. A resistance r1 of the resistances 141 and 142 is 25×5=125 ohms. A capacitance c1 of the capacitor 143 is 30/5=6 pF. An amplitude of the signal 14 becomes equal to an amplitude of the access measuring point of FIG. 9, where VOH/VOL level. In the double data rate SRAM, the high level is 1.7V whilst the low level is 0.8V, (Vccq=2.5V), whereby the large amplitude signal is changed to a small amplitude signal. The second end circuit 150 has the same circuit configuration as the first end circuit 140. The second end circuit 150 comprises the p-channel switching MOSFET 154, resistances 151 and 152 and a capacitor 153. The second end circuit 150 changes the large amplitude signal 13 to the small amplitude signal 15, whereby tL'=tL, and tH'=tH, and t1' from the rising edge of the signal 10 to the cross point of the signals 14 and 15 is an intermediate value between tL' and tH' and close to an averaged value of tL' and tH'.

Figure 10:
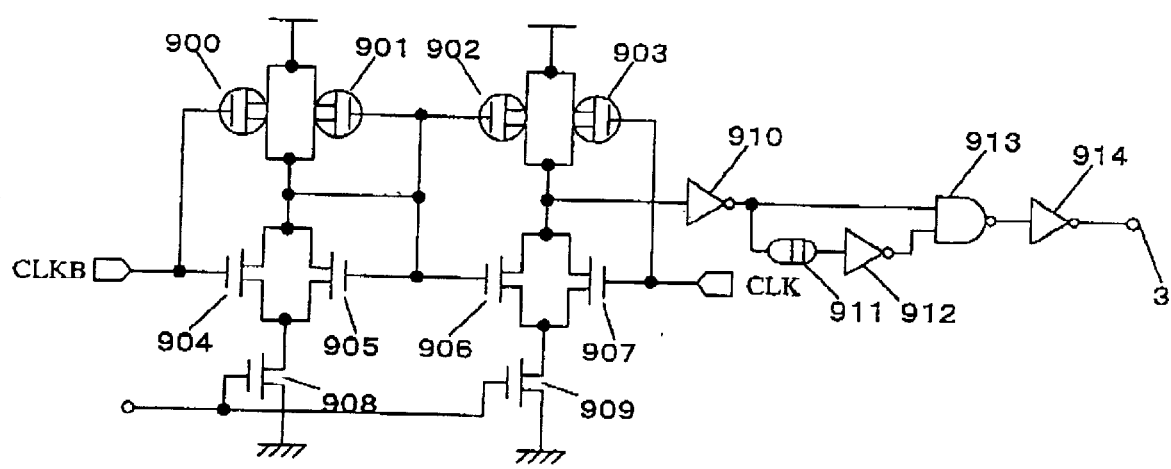
FIG. 10 is illustrative of an input first stage circuit.

The input delay circuit 160 has the same circuit configuration of the input first stage circuit 501 shown in FIG. 10 which is illustrative of an input first stage circuit. The input delay circuit 160 comprises the p-channel switching MOSFETs 161, 162, the n-channel switching MOSFETs 163, 164, inverters 165 and 167 and a NAND-gate 166. The input delay circuit 160 may be reduced in transistor size or not reduced. The reduction rate of the input delay circuit 160 is not needed to be the same as the first and second output delay circuits. The input delay circuit 160 changes the output signal 16 to the power voltage level upon the cross point of the falling of the signal 14 and the rising of the signal 15. The input delay circuit 160 changes the output signal 16 to the ground voltage level upon the cross point of the rising of the signal 14 and the falling of the signal 15. The pulse width of the output signal 16 is almost the same as the pulse width of the reference signal 10. The delay device 911 provided in the input first stage circuit 501 shown in FIG. 10 is not needed.

The clock signal CLK and the reversed phase clock signal CLKB have high level of 1.6V and low level of 0.9V (Vcc=2.5V) and 1V/nsec. The signals 14 and 15 of the input delay circuit 160 have a high level of 1.7V and a low level of 0.8V and a 1V/nsec. The delay time t0 of the input first stage circuit is almost the same as the delay time t0' of the input delay circuit 160, provided that a difference between them is only a few ps to several tends ps.

The inverter 11 corresponds to an inverter 1000 or 1001 shown in FIG. 8. It is not necessary to reduce the inverter 11 at the same reduction rate. The control circuit 170 comprises a SR flip-flop circuit 171, a delay device 175 and an inverter 176 for reduction in consumed current. The control circuit 170 activates activation signals 173 to the end circuits 140 and 150 and also an activation signal to the input delay circuit 160 at a rising edge of the signal 10. The control circuit 170 inactivates the same at a rising of the signal 177.

It is preferable that the input delay circuit 160 is placed close to the input first stage circuit 501 and the first and second output delay circuits 100 and 120 and the first and second and circuits 140 and 150 are placed close to the output circuit 520 for reduction to noise. It is not necessary that the output circuit 520 is placed close to the input first stage circuit 501. The first and second output delay circuits 100 and 120 use power line and ground line of the output circuit 520 whilst the input delay circuit 160 uses the other power and ground lines.

The first and second output delay circuits 100 and 120 has the same circuit configurations as the output circuit 520 and the input delay circuit 160 has the same circuit configurations as the input first stage circuit 501, whereby the same delay times as the output circuit 520 and the input first stage circuit 501 can be obtained, whereby it is possible to do a highly accurate adjustment to the delay time. The first and second end circuits 140 and 150 have the same circuit configuration as the end circuit 530, whereby it is possible to do a highly accurate adjustment to the delay time. The first and second output delay circuits 100 and 120 and the input delay circuit 160 arc provided so that if the delay time of the output circuit is different between in a high level output and a low level output, then an intermediate delay time between them can be obtained, whereby it is possible to do a highly accurate adjustment to the delay time. This highly accurate adjustment to the delay time is available in wide ranges of voltage, temperature, manufacturing variation and frequency. It is also possible to do size-reductions to the individual circuits of the delay circuit so that the delay circuit is reduced in size and a consumed current can be reduced.

Figure 11:
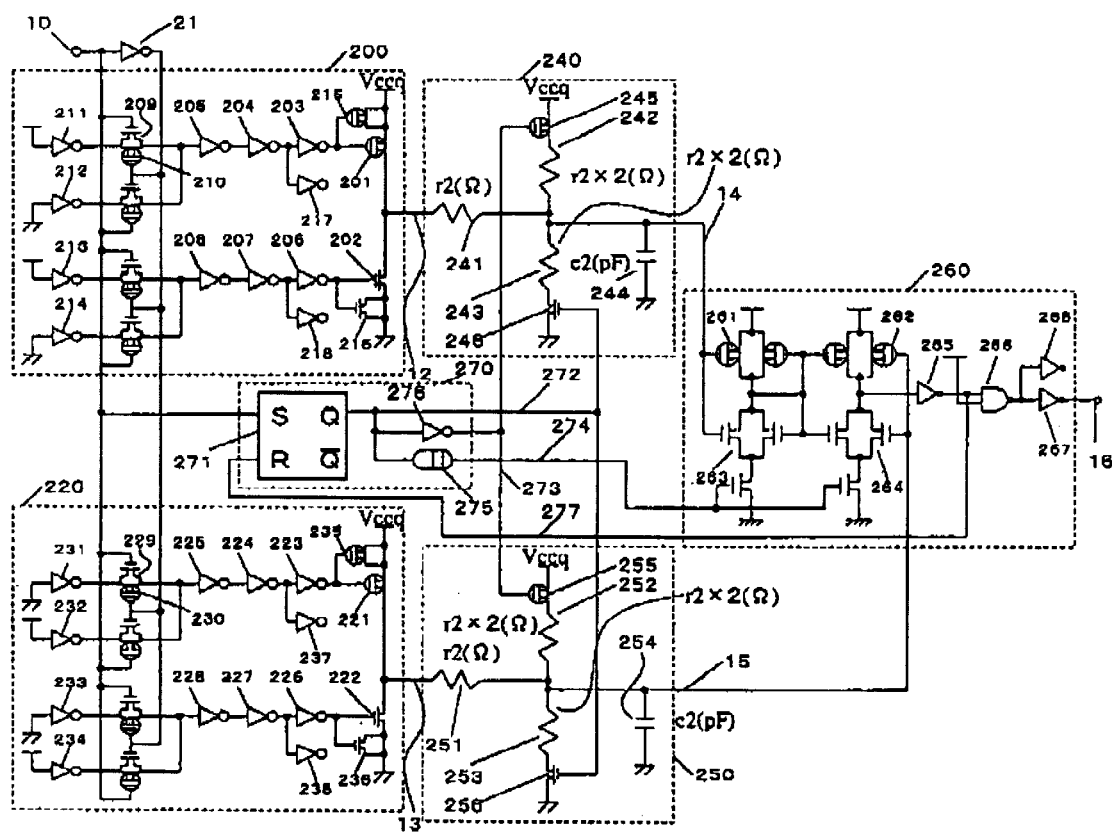
FIG. 11 is a circuit diagram illustrative of a second novel delay circuit in a second embodiment in accordance with the present invention.

A second embodiment in accordance with the present invention will be described. FIG. 11 is a circuit diagram illustrative of a second novel delay circuit in a second embodiment in accordance with the present invention. The delay circuit comprises a first output delay circuit 200 and a second output delay circuit 220 operable in opposite phase to the first output delay circuit 200, a first end circuit 240 connected to the first output delay circuit 200, a second end circuit 250 connected to the second output delay circuit 220, an input delay circuit 260 connected to the first and second end circuits 240 and 250, an inverter 21 connected to the first and second output delay circuits 200 and 220 for inputting input signals in normal and opposite phases thereto, and a control circuit 270 connected to the first and second end circuits 240 and 250 and the input delay circuit 260.

In the above first embodiment, the first and second output delay circuits 100 and 120 have a uniform transistor size reduction rate, for which reason in consideration of limitation of scaling down, the reduction rate depends upon the transistor size having a smallest gate length, whereby the output transistors 101, 102, 121 and 122 have sizes in the range of several tends micrometers to one hundred several tends micrometers. The resistance values of the end circuits 140 and 150 are limited to be enlarged or increased, whereby insufficient size reductions can be obtained.

In this second embodiment, however, the first output delay circuit 200 has further dummy p-channel and n-channel MOSFETs 215 and 216 for adjustment to he load and dummy inverters 217 and 218. For example, the reduction rate of the transistors on the previous stage of the inverters 203 and 206 is one fifth. The reduction rate of the inverters 203 and 206 is one twenty fifth. The reduction rate of the dummy inverters 217 and 218 is four twenty fifth. The reduction rate of the output transistors 201 and 202 is one one-hundredth. The reduction rate of the dummy output transistors 215 and 216 is four one-hundredth. Without changing a ratio of the transistor size to load of the next stage, the reduction rate of the output transistors are made into one one-hundredth, whereby a remarkable scale down and a remarkable reduction in consumed current can be obtained. The second output delay circuit 230 has the same circuit configuration as the first output delay circuit 200. The same transistor size reduction can be obtained.

In the first embodiment, the first and second end circuits 140 and 150 need the power voltage of Vccq/2 which has to be generated in a chip. This is not preferable for scaling down and reduction in consumed current.

In this second embodiment, however, the first end circuit 240 comprises resistances 241, 242, 243 and switching transistors 245 and 2456 and a capacitor 224. The resistance value r2 of the above resistances is r2=25×100=2.5 k ohms The capacitance value c2 of the capacitor is 2c=30×100=0.3 (pF). The resistance value of the resistance 241 is 2.5 k ohms. The resistance value of the resistances 242 and 243 is 5 k ohms. The capacitance value of the capacitor 244 is 0.3 (pF). The second end circuit 250 has the same circuit configuration as the first end circuit 240. When the capacitance values of the capacitors 246 and 256 are so small as about 0.3 pF, the gate capacitances Cp and Cn of the p-channel and n-channel MOSFETs 261, 262, 263 and 264 on the next stage are considerable, for which reason c2=0.3−(Cp+Cn) (pF), whereby it is possible to do a highly accurate adjustment to the delay time.

The input delay circuit 260 is provided with a dummy inverter 268 for size reduction of the inverter 267 so that a transistor size reduction on the next stage can be obtained. The inverter 21 and the control circuit 270 are the same as in the first embodiment.

In this second embodiment, the dummy transistors are provided for the transistors 201, 202, 221, 222, and the inverters 203 and 204, 213, 214, 267 for size reductions thereof. It is also possible to provide the dummy transistors for the inverters 204, 207, 224 and 227 and the inverters 205, 208, 225 and 228.

Figure 12:
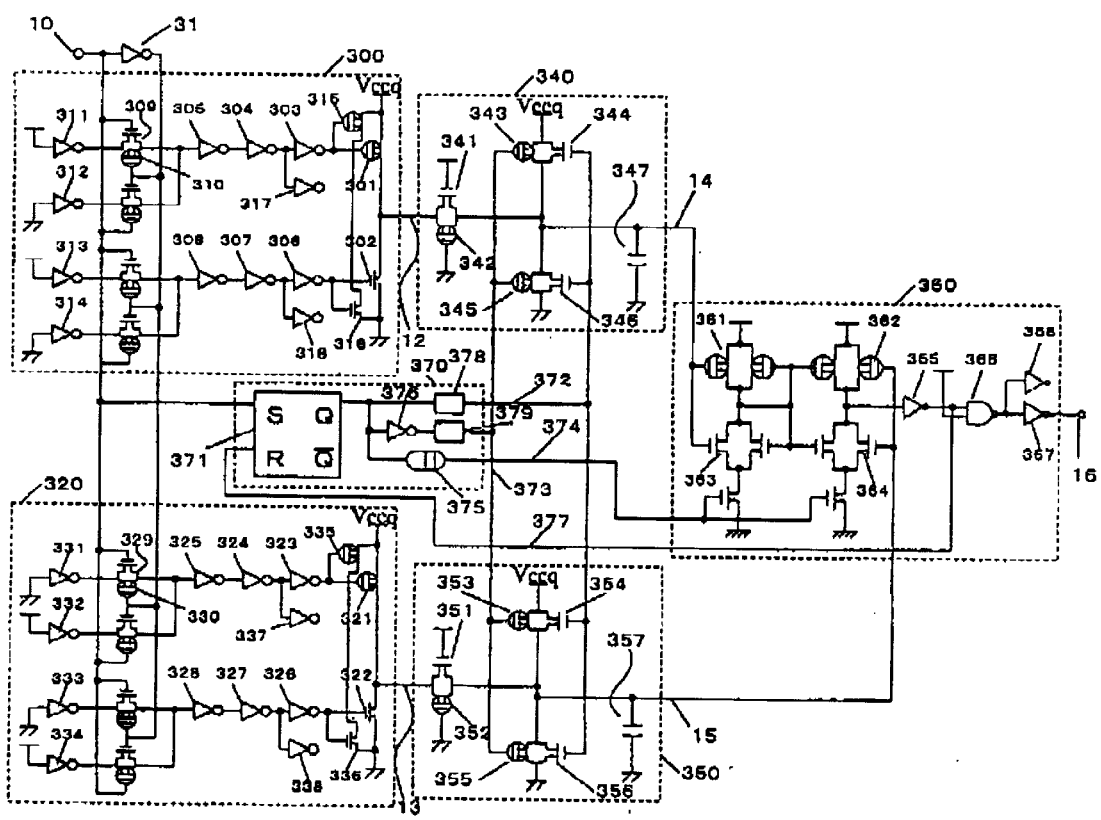
FIG. 12 is a circuit diagram illustrative of a third novel delay circuit in a third embodiment in accordance with the present invention.

A third embodiment in accordance with the present invention will be described. FIG. 12 is a circuit diagram illustrative of a third novel delay circuit in a third embodiment in accordance with the present invention. The delay circuit comprises a first output delay circuit 300 and a second output delay circuit 320 operable in opposite phase to the first output delay circuit 300, a first end circuit 340 connected to the first output delay circuit 300, a second end circuit 350 connected to the second output delay circuit 320, an input delay circuit 360 connected to the first and second end circuits 340 and 350, an inverter 31 connected to the first and second output delay circuits 300 and 320 for inputting input signals in normal and opposite phases thereto, and a control circuit 370 connected to the first and second end circuits 340 and 350 and the input delay circuit 360. In this third embodiment, the first output delay circuit 300 has a circuit connection that dummy output transistors 315 and 316 are connected to each other in those drain sides to cause a mirror effect that a gate voltage of the n-channel MOSFET 301 is fallen whereby a capacitor between the gate and drain prevents the drain from being risen. As a result, it is possible to realize a further highly accurate adjustment to the delay time. The second output delay circuit 330 has the same circuit configuration as the first output delay circuit 300. Dummy output transistors 335 and 336 are connected to each other in those drain sides to cause the mirror effect.

Further, in this third embodiment, the first and second end circuits 340 and 350 comprise pairs of p-channel and n-channel MOSFETs 341 and 342, 343 and 344, and 345 and 346. Each transistor pair has the resistance equal to the resistance values of the individually corresponding resistances. In this case, the transistors are preferably used in unsaturated states, for which reason the high level of the activation signal 372 is higher than Vccq and the low level of the activation signal 373 is lower than the ground level, so that the power voltage range for using the each transistor pair as the resistance is made wide. Even the first and second end circuits 340 and 350 has the pair of the p-channel and n-channel MOSFETs to form the resistance, multiple stage connections of the p-channel and n-channel MOSFETs to form the resistance may be available.

The input delay circuit 340 and the inverter 32 are the same as in the second embodiment. The control circuit 350 is almost the same as in the second embodiment, wherein voltage level converters 378 and 379 so that the high level of the activation signal 572 to the n-channel MOSFETs in the first and second end circuits 340 and 350 is higher than Vccq and the low level of the activation signal 573 to the p-channel MOSFETs in the first and second end circuits 340 and 350 is lower than the ground level.

Figure 13A:
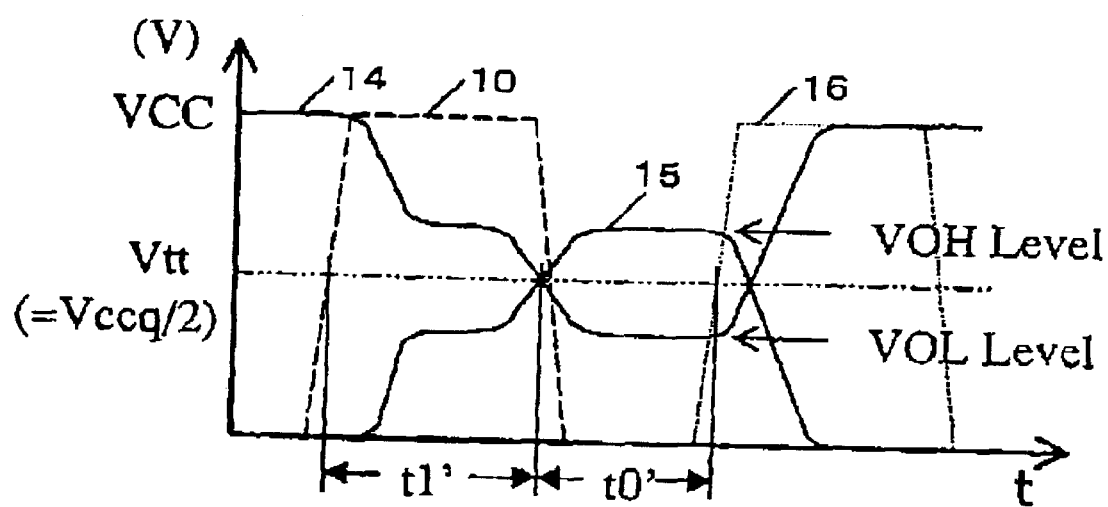
FIG. 13A is a diagram illustrative of waveforms of typical power ratio of p-channel and n-channel MOSFETs.
Figure 13B:
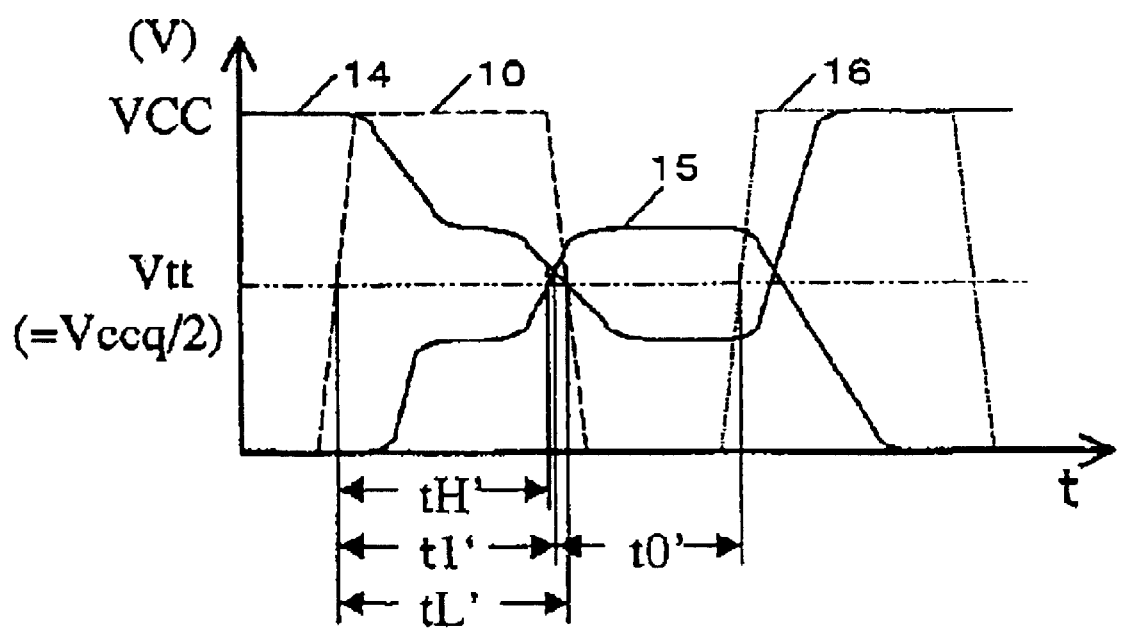
FIG. 13B is a diagram illustrative of waveforms of varied power ratio of p-channel and n-channel MOSFETs, wherein a power of the p-channel MOSFET becomes high whilst the power of the n-channel MOSFET becomes low.

FIG. 13A is a diagram illustrative of waveforms of typical power ratio of p-channel and n-channel MOSFETs. FIG. 13B is a diagram illustrative of waveforms of varied power ratio of p-channel and n-channel MOSFETs, wherein a power of the p-channel MOSFET becomes high whilst the power of the n-channel MOSFET becomes low.

Figure 4:
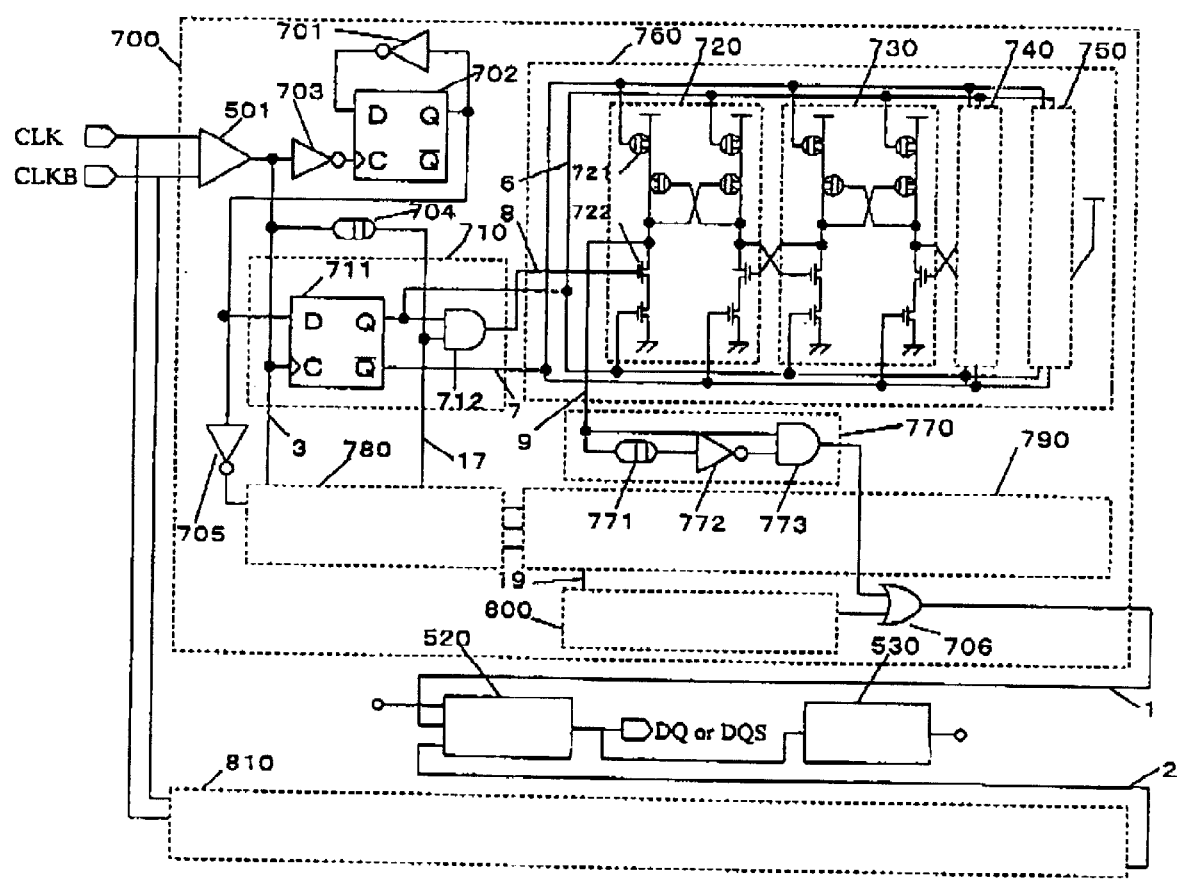
FIG. 4 is a block diagram illustrative of a clock supplying semiconductor circuit.
Figure 5:
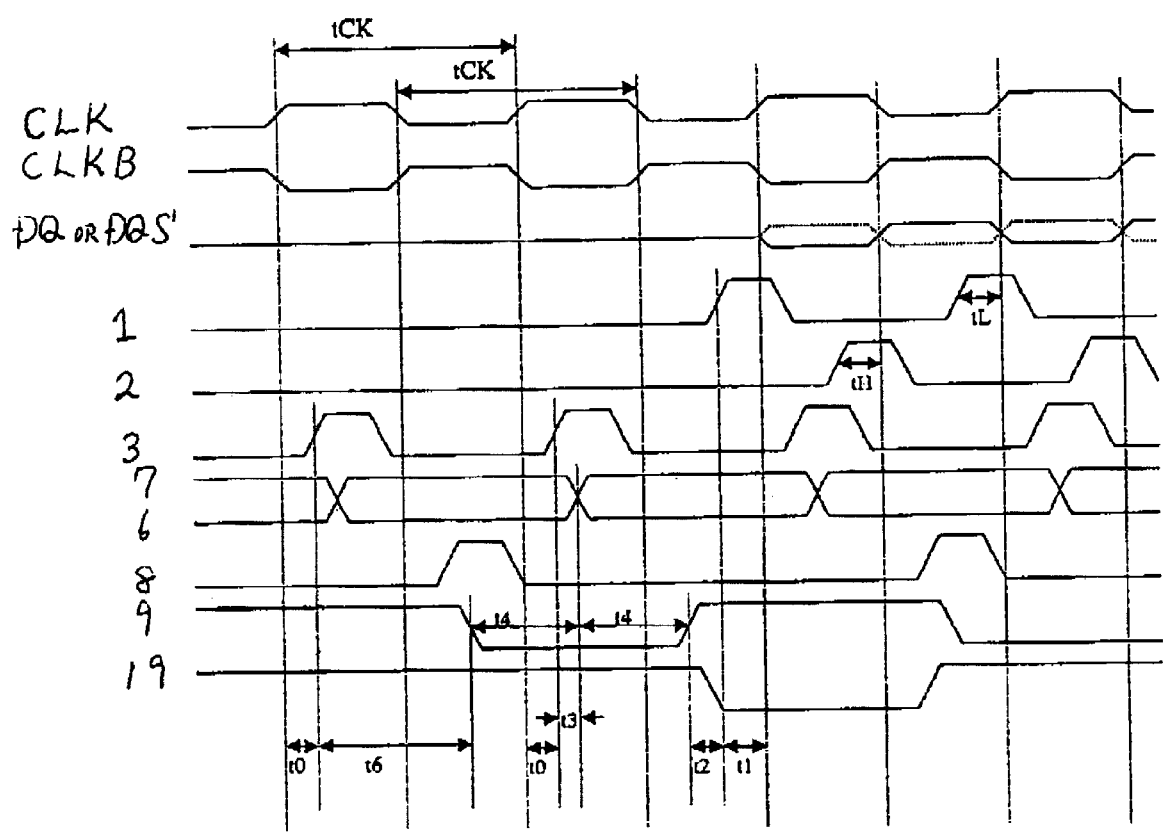
FIG. 5 is a timing chart illustrative of waveforms of a clock supplying semiconductor circuit of FIG. 4.
Figure 6A:
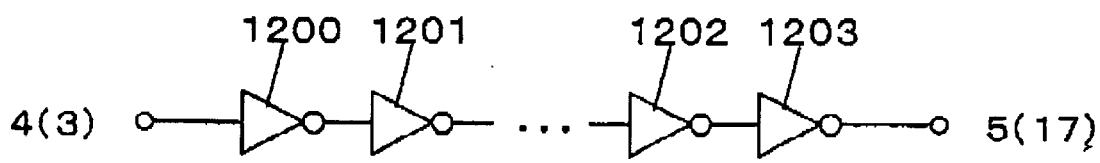
FIG. 6A is a circuit diagram illustrative of a first conventional circuit configuration of a delay device.
Figure 6B:
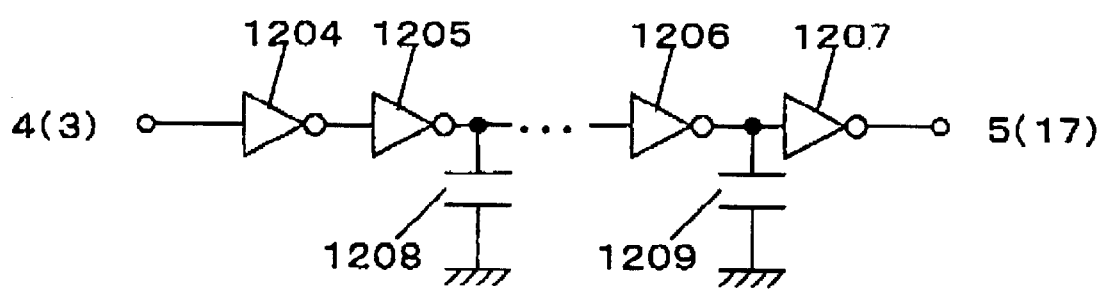
FIG. 6 is a circuit diagram illustrative of a second conventional circuit configuration of a delay device.

The above novel delay circuits are of course applicable to the clock supply semiconductor circuit of FIG. 4.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor memory device comprising:
   an input first stage circuit for receiving an external input of a clock signal;
   an output circuit connected to the input first stage circuit for receiving an output signal from the input first stage circuit so that the output circuit outputs data on the basis of the output signal; and
   a delay device connected to the input first-stage circuit for delaying the output signal from the input first-stage circuit in order for synchronizing in timing between the data from the output circuit and the lock signal, wherein the delay device further comprises an output delay circuit having a circuit configuration substantially identical with or equivalent to a circuit configuration of the output circuit, and an input delay circuit being connected to the output delay circuit and the input delay circuit having a circuit configuration substantially identical with or equivalent to a circuit configuration of the input first-stage circuit.

2. The semiconductor memory device as claimed in claim 1, wherein the semiconductor memory device is operable in double data rate.

3. The semiconductor memory device as claimed in claim 1, wherein the delay device comprises:

a first output delay circuit having a circuit configuration substantially identical with or equivalent to a circuit configuration of an access path circuit of the output circuit;

a second output delay circuit having a circuit configuration substantially identical with or equivalent to a circuit configuration of the first output delay circuit and being operable in reverse phase to the first output delay circuit; and an input delay circuit connected to the first and second output delay circuits and the input delay circuit having a circuit configuration substantially identical with or equivalent to a circuit configuration of the input first-stage circuit, so that upon input of the clock signal, the first output delay circuit outputs a first delay signal having a first delay time equal to a delay time in a low level output from the output circuit, whilst the second output delay circuit outputs a second delay signal having a second delay time equal to a delay time in a high level output from the output circuit, whereby the input delay circuit receives the first and second signals from the first and second output delay circuits so as to output a third delay signal having a third delay time equal to a delay time of the input first stage circuit.

4. The semiconductor memory device as claimed in claim 3, further comprising:

a first end circuit connected between the first output delay circuit and the input delay circuit for reducing an amplitude of the first delay signal to send an amplitude-reduced first delay signal to the input delay circuit; and a second end circuit connected between the second output delay circuit and the input delay circuit for reducing an amplitude of the first delay signal to send an amplitude-reduced first delay signal to the input delay circuit.

5. The semiconductor memory device as claimed in claim 3, wherein the first and second output delay circuits and the input delay circuit are reduced in size as compared to the output circuit and the input first stage circuit.

6. The semiconductor memory device as claimed in claim 5, wherein each of the first and second output delay circuits has a dummy output transistor.

7. The semiconductor memory device as claimed in claim 3, further comprising a control circuit connected to the first and second end circuits and also connected to the input delay circuit for activating the first and second end circuits and the input delay circuit after a reference signal has been inputted into any one of the first and second output delay circuits, and also for inactivating the first and second end circuits and the input delay circuit after a signal has been outputted from the input delay circuit.

8. A data input/output circuit comprising:

an input first stage circuit for receiving an external input of a clock signal;

an output circuit connected to the input first stage circuit for receiving an output signal from the input first stage circuit so that the output circuit outputs data on the basis of the output signal; and a delay device connected to the input first-stage circuit for delaying the output signal from the input first-stage circuit in order for synchronizing in timing between the data from the output circuit and the lock signal, wherein the delay device further comprises an output delay circuit having a circuit configuration substantially identical with or equivalent to a circuit configuration of the output circuit, and an input delay circuit being connected to the output delay circuit and the input delay circuit having a circuit configuration substantially identical with or equivalent to a circuit configuration of the input first-stage circuit.

9. The data input/output circuit as claimed in claim 8, wherein the semiconductor memory device is operable in double data rate.

10. The data input/output circuit as claimed in claim 8, wherein the delay device comprises:

a first output delay circuit having a circuit configuration substantially identical with or equivalent to a circuit configuration of an access path circuit of the output circuit;

a second output delay circuit having a circuit configuration substantially identical with or equivalent to a circuit configuration of the first output delay circuit and being operable in reverse phase to the first output delay circuit; and an input delay circuit connected to the first and second output delay circuits and the input delay circuit having a circuit configuration substantially identical with or equivalent to a circuit configuration of the input first-stage circuit, so that upon input of the clock signal, the first output delay circuit outputs a first delay signal having a first delay time equal to a delay time in a low level output from the output circuit, whilst the second output delay circuit outputs a second delay signal having a second delay time equal to a delay time in a high level output from the output circuit, whereby the input delay circuit receives the first and second signals from the first and second output delay circuits so as to output a third delay signal having a third delay time equal to a delay time of the input first stage circuit.

11. The data input/output circuit as claimed in claim 10, further comprising:

a first end circuit connected between the first output delay circuit and the input delay circuit for reducing an amplitude of the first delay signal to send an amplitude-reduced first delay signal to the input delay circuit; and a second end circuit connected between the second output delay circuit and the input delay circuit for reducing an amplitude of the first delay signal to send an amplitude-reduced first delay signal to the input delay circuit.

12. The data input/output circuit as claimed in claim 10, wherein the first and second output delay circuits and the input delay circuit are reduced in size as compared to the output circuit and the input first stage circuit.

13. The data input/output circuit as claimed in claim 12, wherein each of the first and second output delay circuits has a dummy output transistor.

14. The data input/output circuit as claimed in claim 10, further comprising a control circuit connected to the first and second end circuits and also connected to the input delay circuit for activating the first and second end circuits and the input delay circuit after a reference signal has been inputted into any one of the first and second output delay circuits, and also for inactivating the first and second end circuits and the input delay circuit after a signal has been outputted from the input delay circuit.

\* \* \* \* \*